United States Patent
Prindiville

(12) 
(10) Patent No.: US 6,543,510 B1
(45) Date of Patent: Apr. 8, 2003

(54) APPARATUS AND METHODS FOR COVERLAY REMOVAL AND ADHESIVE APPLICATION

(75) Inventor: Casey Prindiville, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 299 days.

(21) Appl. No.: 09/589,616

(22) Filed: Jun. 7, 2000

(51) Int. Cl.[7] ............................................. B32B 35/00
(52) U.S. Cl. ..................... 156/517; 156/518; 156/520; 156/521; 156/537; 156/538; 156/580
(58) Field of Search ................. 156/260, 261, 156/262, 263, 259, 324, 344, 353, 358, 361, 391, 512, 517, 518, 520, 521, 537, 538, 580, 584; 428/41.7, 41.8, 950, 975, 976

(56) References Cited

U.S. PATENT DOCUMENTS

| | | | |
|---|---|---|---|
| 3,788,572 A | * | 1/1974 | Wroblewski .............. 242/332.1 |
| 5,729,049 A | | 3/1998 | Corisis et al. |
| 6,012,502 A | | 1/2000 | VanNortwick et al. |
| 6,013,535 A | | 1/2000 | Moden et al. |
| 6,016,004 A | | 1/2000 | Schrock |
| 6,025,212 A | | 2/2000 | VanNortwick et al. |
| 6,051,449 A | | 4/2000 | Schrock |
| 6,080,263 A | * | 6/2000 | Saito et al. .................. 156/253 |

* cited by examiner

Primary Examiner—Richard Crispino
Assistant Examiner—Sing P. Chan
(74) Attorney, Agent, or Firm—Klarquist Sparkman, LLP

(57) ABSTRACT

Apparatus and methods for synchronously removing coverlay film from an adhesive film and applying an adhesive strip cut from the adhesive film to cover one or more reject die sites and/or functional die sites on semiconductor package support elements are disclosed. Reject die sites on defective substrates are covered prior to encapsulation.

8 Claims, 4 Drawing Sheets

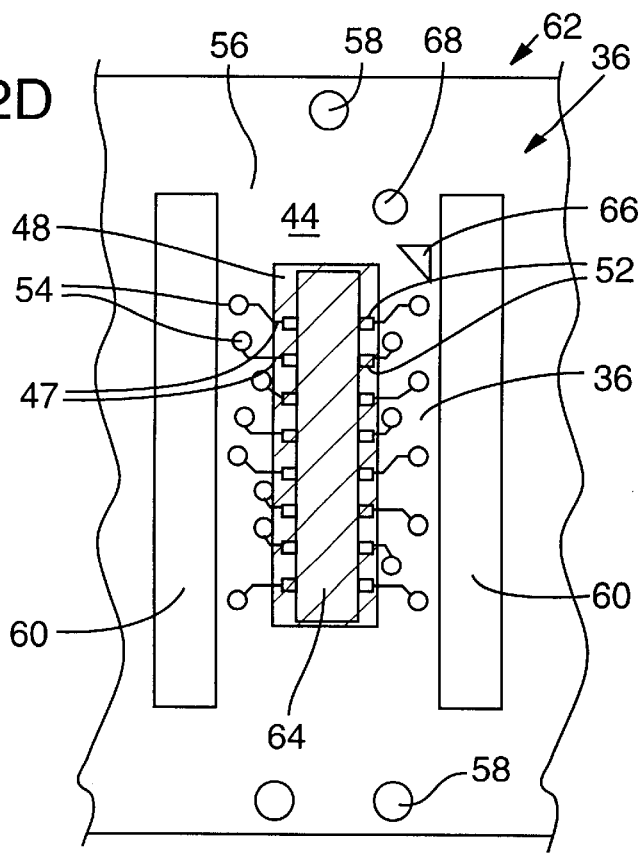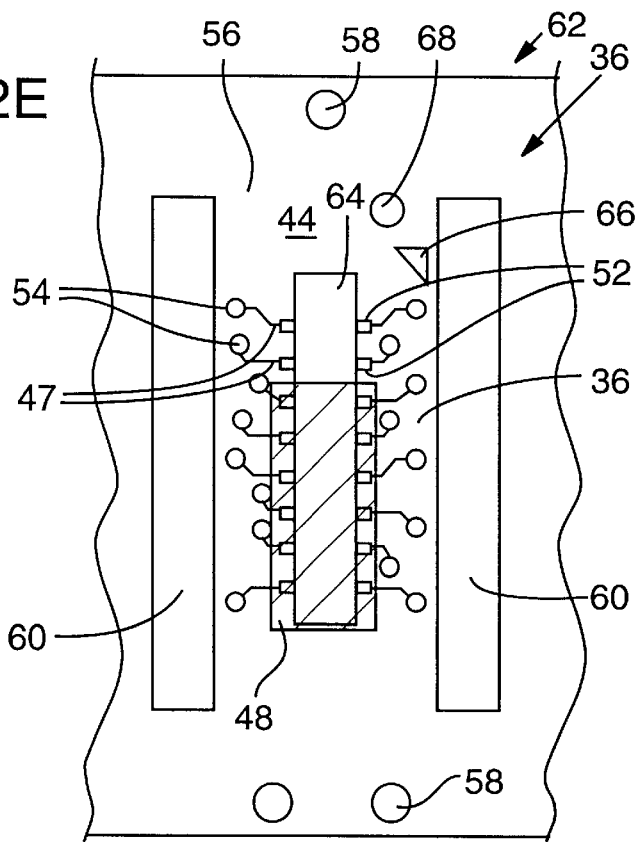

APPARATUS AND METHODS FOR COVERLAY REMOVAL AND ADHESIVE APPLICATION

FIELD OF THE INVENTION

This invention relates generally to apparatus and methods for semiconductor package fabrication and more specifically to apparatus and methods for synchronous coverlay film removal and adhesive application to semiconductor support elements and the like.

BACKGROUND AND SUMMARY OF THE INVENTION

In semiconductor manufacture, a single semiconductor die (or chip) can be packaged within a sealed package. The package protects the die from damage and from contaminants in the surrounding environment. In addition, the package provides a substantial lead system for electrically connecting the integrated circuits on the die to the outside world.

One type of semiconductor package 10 is illustrated in FIG. 1A. The package 10 includes a substrate 12 having a planar die attach surface or die site 22. A semiconductor die 16 is mounted to an upper surface of the substrate 12 on the die site 22. The die 16 is typically adhesively bonded to the substrate 12 with an adhesive layer 34. An encapsulating resin 38 encapsulates the die 16.

In addition to the die site 22 on the upper surface, the substrate 12 includes an opposing conductor surface 9 wherein conductors 18 are formed in a required pattern. A wire bond opening 26 in the substrate 12 provides access for bonding wires 28. The bonding wires 28 are connected to the conductors 18 and to bond pads (not shown) on the die 16. A glob top 40 is formed over the wires 28 for protection.

The semiconductor package 10 also includes an array of solder balls 14. The solder balls 14 are bonded to ball bonding pads 24 on the conductors 18.

As shown in FIG. 1B, the substrate 12 is initially a segment 32 of a support element 30. The support element 30 includes multiple substrates 12 (and thus multiple die sites 22). The support element is used to fabricate multiple semiconductor packages 10. The support element facilitates the fabrication process in that different operations, such as die attach and wire bonding, can be performed at the same time on each of the substrates. Following the fabrication of the semiconductor packages 10 from the support element 30, the support element is singulated into individual semiconductor packages.

The process for packaging semiconductor dice includes matching a die to each die site on the support element. The die is attached, using an adhesive, to the die site over the wire bond opening 26 so that the die may be electrically connected to the substrate. Currently available support elements typically include one or more substrates that are defective or non-functional, i.e., the substrates include "reject die sites." Individual substrates of a support element may be non-functional for a variety of reasons, such as faulty electrical circuitry of a substrate. Such defect substrates of the support element cannot be utilized to fabricate a functional semiconductor package but cannot be separated from the support element prior to processing of the other substrates on the support element. If the defective substrates are separated from the support element, such action necessarily limits the number of substrates that may be processed at one time using the separated support element. Thus, physical separation of defect substrates from the support element prior to fabrication of the semiconductor packages is not preferred.

When functional dice are attached to the "reject die sites" of the support element and further are processed, the resulting semiconductor packages are necessarily defective. This sacrifices functional dice, thereby increasing semiconductor package manufacturing costs and decreasing yields. To avoid the added cost (i.e., sacrificing functional dice), a "reject die site" on a support element could simply be skipped or omitted during the die attach process. Regrettably, omitting attachment of a die to a die site on a support element causes problems during the encapsulation process.

During the encapsulation process, liquid encapsulation material flows over and around the attached dice and substrates of the support element. If one or more bonding slots are left open, i.e., a die is not attached to a die site of the support element, the encapsulation material flows through the uncovered opening 26. When the encapsulation material flows through such openings, it contaminates dice adjacent and/or near the uncovered opening. This is known as "bleeding or flashing." The bleeding of encapsulation material produces even more defective semiconductor packages, further increasing manufacturing costs and lowering yield. Moreover, bleeding of the encapsulation material may stick to the mold body and contaminate the next support element processed through the encapsulation machine.

In attempt to avoid (1) sacrificing functional dice by attaching the dice on reject die sites, (2) contaminating adjacent dice and mold bodies by omitting attachment of dice to reject die sites, and (3) processing support elements that include a minimal number of substrates due to prior separation of the defective substrates, the industry pays a premium price for support elements having no reject die sites. This also increases semiconductor package manufacturing costs.

Accordingly, there is a need for a process for making semiconductor packages using support elements having one or more reject die sites without contaminating adjacent dice and without destroying functional dice by attaching the dice to reject die sites. To this end, the present invention provides apparatus and methods for applying a cover member, such as a strip of self-adhesive film, to the reject die sites. The cover member covers the reject die sites prior to encapsulation thereby eliminating the risk of contamination of adjacent dice on a support element during encapsulation and preserving functional dice for use on functional die sites. Further, the apparatus and methods of the present invention apply with a predetermined amount of force exact lengths of adhesive film to the support element and synchronously remove the adhesive film's coverlay film just prior to application of the adhesive to the support element.

According to the present invention, reject die sites on a support element are covered prior to the encapsulation process using the apparatus and methods of the present invention. More specifically, the apparatus and methods of the present invention synchronously remove a coverlay film from adhesive film, cuts and applies exact lengths of adhesive to reject die sites on the support element to act as a cover member thereon (or to allow for attachment of a separate cover member thereto). The apparatus and methods of the present invention may also be used to synchronously remove a coverlay film from adhesive film, and to cut and apply exact lengths of adhesive to functional die sites on the support element for attachment of functional dice thereto. The application of adhesive strips as cover members to reject die sites (or for attachment of a separate cover member thereto) virtually eliminates bleeding or flashing during encapsulation due to the presence of reject die sites while avoiding the need to sacrifice functional dice to cover such reject die sites. The apparatus and methods of the present invention further provide an efficient process for removal of the adhesive film's coverlay film with the synchronous application of cover members to reject die sites of a support element.

BRIEF DESCRIPTION OF THE DRAWINGS

FIGS. 2C–2E are bottom views of an enlarged portion of a covered reject die site on the support element shown in FIG. 2A.

DETAILED DESCRIPTION OF THE INVENTION

Figure 1A:
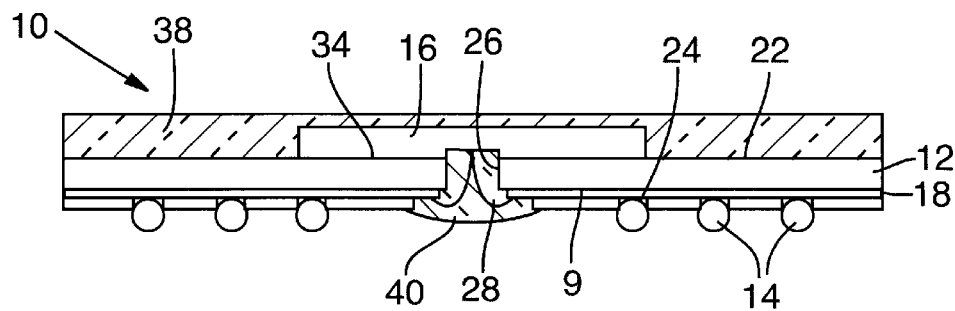
FIG. 1A is a schematic cross-sectional view of a conventional semiconductor package taken along section line 1A—1A of FIG. 1B.
Figure 1B:
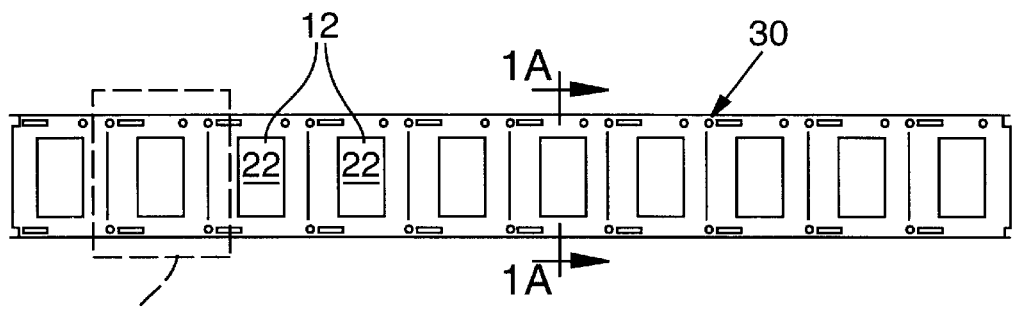
FIG. 1B is a plan view of a conventional support element having a multitude of exposed die sites for fabricating semiconductor packages, such as shown in FIG. 1A.
Figure 2A:
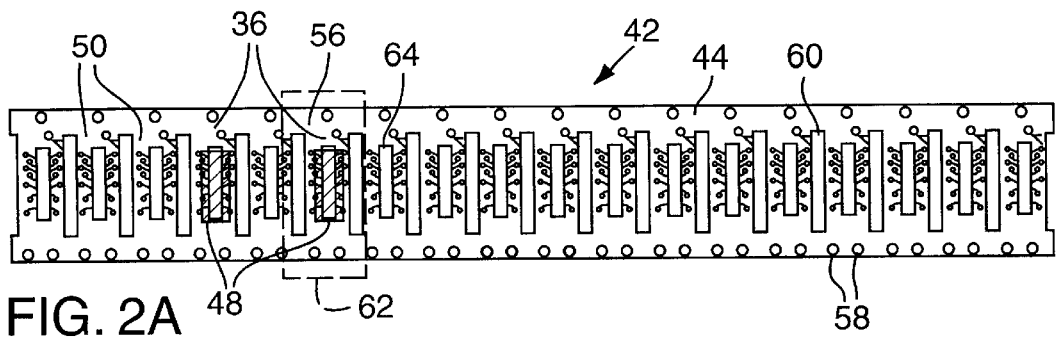
FIG. 2A is a plan view of a support element containing multiple die sites, including reject die sites that have been covered with an adhesive strip or other cover member using the apparatus and methods of the present invention.
Figure 2B:
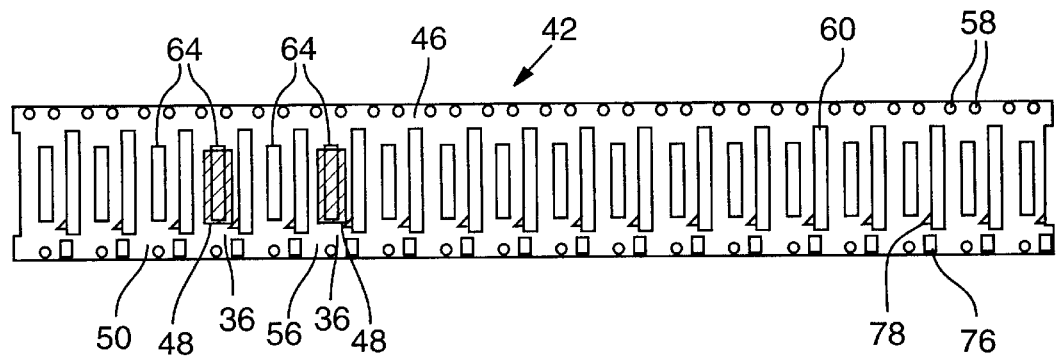
FIG. 2B is a bottom view of the support element shown in FIG. 2A.

The present invention provides apparatus and methods for attachment of an adhesive strip as a cover member on one or more reject die sites 36 of semiconductor package support elements 42 (FIGS. 2a and 2B). The apparatus and method of the present invention synchronously remove a coverlay film from a reel of adhesive film as it cuts and applies exact lengths of adhesive to the support element.

Figure 2C:
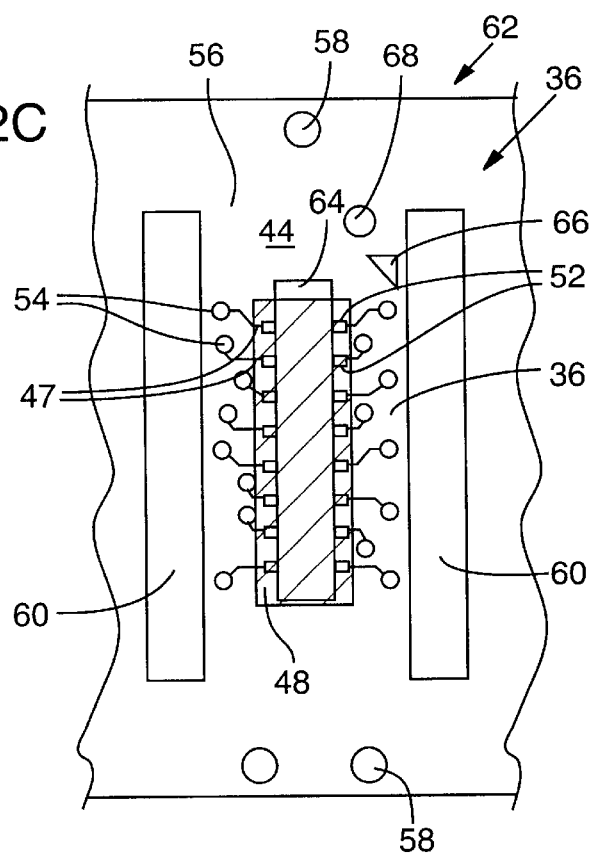

With reference to FIGS. 2A–2C, a representative support element 42 includes multiple substrates 56. Each substrate 56 is a segment of the support element 42 and will subsequently be separated from the adjacent substrates 56. The support element shown in FIGS. 2A and 2B includes 18 substrates 56. However, this number is merely exemplary and the support element 42 may include a fewer or greater number of substrates 56. The substrates 56 are typically positioned side-by-side and are integrally connected. As stated above, the support element 42 facilitates the fabrication process in that different operations, such as die attach and wire bonding, can be performed at the same time on multiple substrates 56.

Each substrate 56 further includes a first planar surface 44 (FIG. 2A) and a second planar surface 46 (FIG. 2B). In FIG. 2C a single substrate 56 of support element 42 is illustrated in greater detail. Each substrate 56 further includes conductors 47 on the first surface 44. Wire bonding pads 52 facilitate the wire bonding process. There is a die attach area on the second surface 46 of the substrate upon which a die (not shown) or a cover member (discussed below) will be attached. The die attach area of each substrate 56 comprises either an "operational" or "functional die site" 50 or a "defective" or "reject die site" 36 (FIGS. 2A and 2B).

A wire bond slot 64 extends from the first surface 44, through the substrate 56 to the second surface 46. Although shown rectangular in shape, wire bond slots 64 are of various sizes and shapes, dependent upon the type of semiconductor package to be fabricated therefrom. The wire bond slots 64 provide access for bonding wires (not shown) that connect die circuitry to corresponding substrate circuitry.

Each reject die site 36 of the support element 42 includes a cover member 48 (cover members 48 are shown with crosshatch in FIGS. 2A–2E). The cover member 48 is attached to the reject die site 36 so as to cover from about 70% to about 100% of the corresponding wire bond slot 64 on the die site. The wire bond slot 64 is covered to prevent contamination through the slot during the encapsulation process. (The support member 42, wire bond slots 64, and die sites 36, 50 are illustrated in FIGS. 2A–2E prior to formation of a solder mask, solder balls or an encapsulation resin that complete formation of a semiconductor package.)

Cover member 48 may comprise any sufficiently rigid material that can be adhered to first surface 44 of the support element 42. Of course, cover member 48 preferably will not comprise a material that would contaminate or otherwise negatively impact the operation of a completed semiconductor package. The cover member 48 material must be able to withstand encapsulation pressures, typically from about 100 psi to about 1800 psi. For example, cover member 48 may comprise single-sided or double-sided pressure-sensitive film, such as KAPTON™ film (available from Precision PCB Services, Inc., of Santa Clara, Calif.) or temperature-sensitive film, such as ABLESTIK™ film, (SKU No. RP444-14 available from National Starch and Chemical Co., of Bridgewater, N.J.). Alternatively, the cover member 48 may comprise a non-functional or reject die.

Cover member 48 is preferably relatively specifically attached to cover a majority of the wire bond slot 64 opening. The percentage of coverage of the wire bond slot 64 with the cover member 48 depends upon the encapsulation material to be used and the width of the wire bond slot 64.

Each functional die site 50 of support element 42 will have a die (not shown) attached thereto, to cover wire bond slot 64. The support element 42 illustrated in FIGS. 2A and 2B is shown prior to attachment of a die. Functional or operational dice (not shown) are attached to functional die sites 50 only.

As shown in FIG. 2A, the support element 42 also includes one or more indexing openings 58 formed through one or more of the substrates 56, proximate longitudinal edges of the support element. The indexing openings 58 permit support element 42 to be handled by automated transfer mechanisms associated with chip bonders, wire bonders, molds, trim machinery, etc. Additionally, support element 42 may include separation openings 60 to facilitate singulation of individual substrates 56 from support element 42 after formation of the semiconductor packages.

Figure 3:
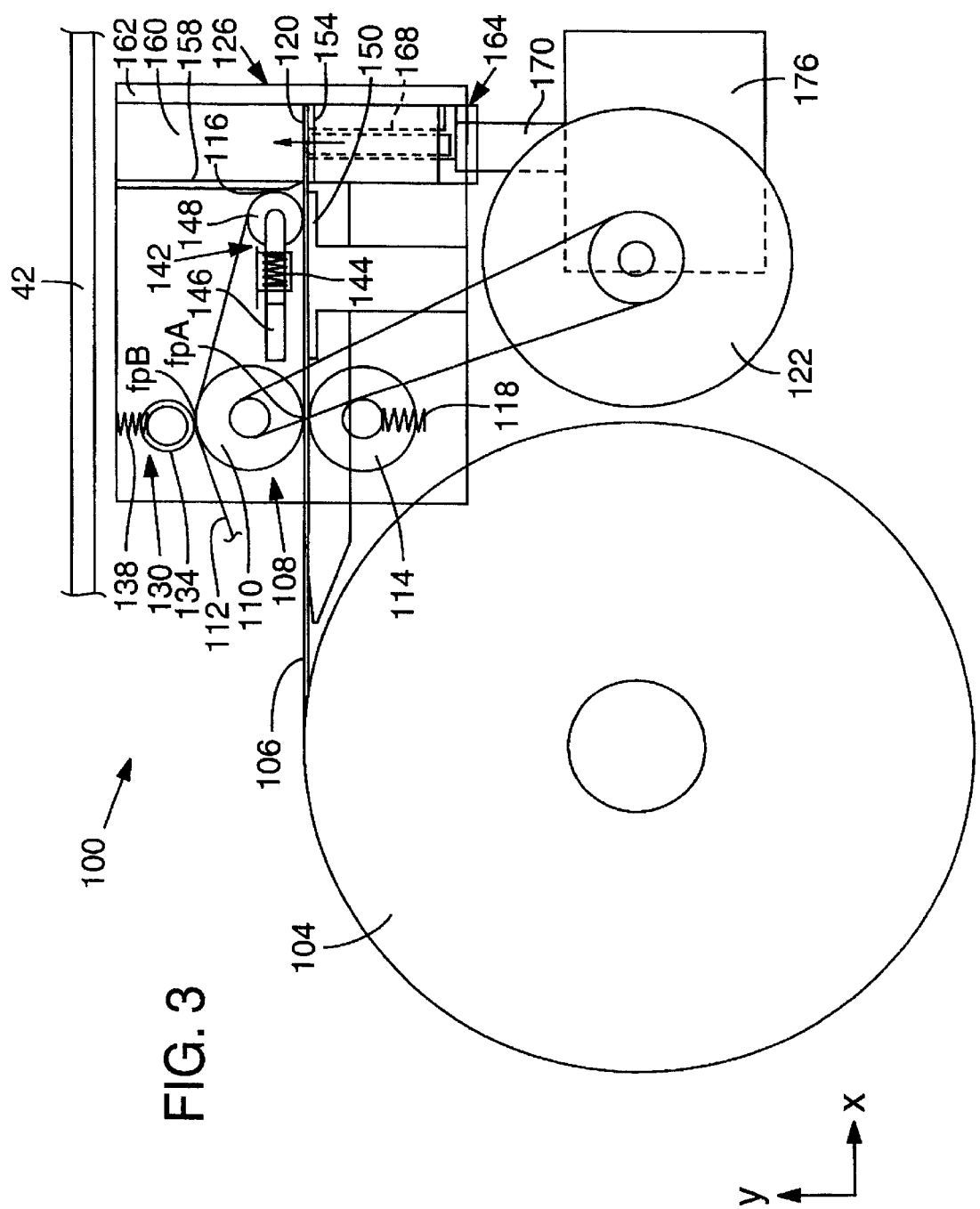
FIG. 3 is a schematic view of the apparatus of the present invention.

Referring to FIG. 3, the adhesive dispensing apparatus 100 of the present invention applies adhesive strips to the support element 42 to function as the cover member 48, to connect a separate cover member 48 thereto (e.g., a reject die), or to attach a functional die thereto. As discussed above, cover members 48 are attached to reject die sites and functional dice are attached to functional die sites. The apparatus and method of the present invention may be used to attach adhesive strips to reject die sites and functional die sites. Adhesive film 106 typically includes a thin layer of adhesive 116 and typically a ridged coverlay film 112. The coverlay film 112 separates the adhesive from itself when the adhesive is spooled on a reel 104.

In general, the adhesive dispensing apparatus 100 of the present invention comprises a reel of adhesive (or "film reel") 104, a drive wheel 108 and a cutting assembly 126. A motor 122 is connected to the drive wheel assembly 108 to drive adhesive film 106 therethrough. The adhesive dispensing apparatus 100 further includes a pinch wheel assembly 130 positioned above the drive wheel assembly 108 to hold the coverlay film 112 between the pinch wheel assembly and the drive wheel assembly 108. A spring-loaded idler assembly 142 is positioned to adjust for slack that may be caused by slippage between the drive wheel assembly and the adhesive film 106.

More specifically, the adhesive dispensing apparatus 100 of the present invention includes one or more film reels 104. The film reel 104 may be mounted to a support frame (not shown) in a manner such that the film reel is freely rotatable. The film reel 104 is adapted to supply continuous lengths of adhesive film 106, either double-sided or single-sided adhesive film, including a coverlay film 112. In the illustrative embodiment there is a single film reel 104 shown. Depending, however, upon the application and the number of adhesive strips 120 required for each die site on the support element 42 (FIG. 2A), the apparatus and methods of the present invention may include a greater number of film reels 104.

The drive wheel assembly 108 of the adhesive dispensing apparatus 100 preferably includes driven push wheel 110 and lower push wheel 114. A first spring 118 is positioned substantially vertically relative to lower push wheel 114 and immediately adjacent the lower push wheel 114. First spring 118 urges the lower push wheel 114 toward adhesive film 106, providing a pinching or friction force (fpA) such that the lower push wheel and the driven push wheel 110 are held tightly against opposing surfaces of the adhesive film 106.

The lower push wheel 114 is preferably free floating in the X-axis direction. The driven push wheel 110 is preferably fixed and drivably connected to a stepper motor 122. The stepper motor 122 is adapted to drive the driven push wheel 110 and, due to frictional force fpA, the lower push wheel 114, through predetermined complete or partial revolutions. Each revolution of the driven push wheel 110 and the lower push wheel 114 moves the adhesive film 106 a corresponding linear amount. Thus, the drive wheel assembly 108 is operable to feed or index a predetermined length of adhesive film 106 into the film cutting assembly 126 for cutting (as discussed below).

The pinch wheel assembly 130 of the adhesive dispensing apparatus 100 preferably comprises an upper pinch roller 134 and second spring 138. The pinch wheel assembly 130 is preferably positioned above and immediately adjacent to the driven push wheel 110 of the drive wheel assembly 108 (see FIG. 3). The upper pinch roller 134 is preferably free floating along the X-axis direction (as is lower push wheel 114). The second spring 138 is preferably positioned in a substantially vertical direction, immediately adjacent the pinch roller 134. The second spring 138 urges the upper pinch roller toward the driven push wheel 110, thereby providing a pinching or friction force (fpB) between the upper pinch roller 134 and the driven push wheel 110. The pinch wheel assembly 130 operates to remove the coverlay film 112 from the adhesive film 106. That is, the coverlay film 112 is removed by the pinch roller 134 by application of friction force (fpB) supplied by second spring 138 between the pinch roller and the driven push wheel 110. As the driven push wheel 110 rotates the coverlay film 112 is peeled away from the adhesive film 106 by a proportional exact amount as the adhesive film is pulled from the film reel 104 and the adhesive 116 is then pushed into the cutting assembly 126. The coverlay film 112 is pushed through the pinch wheel assembly 130 to the outside of adhesive dispensing apparatus 100 for disposal.

The adhesive dispensing apparatus 100 of the present invention further preferably includes an idler assembly 142 positioned downstream of the drive wheel assembly 108 and the pinch wheel assembly 130. The idler assembly 142 includes third spring 144, shaft 146 and an idler roller 148. The idler roller 148 is urged in a downstream direction by the third spring 144. The third spring 144 also allows movement of the idler roller 148 in an upstream direction when force is applied to the idler roller by the coverlay film 112. The third spring 144 thereby provides a push-pull type movement of the idler assembly 142 to allow for slackening or tightening of the adhesive film 106 (as discussed below).

A film guide (not shown) is formed with a guide channel 150 for receiving an adhesive film 106 from each film reel 104. In addition, the guide channel 150 may be adapted to maintain a precise spacing and parallel orientation of ribbons of adhesive film 106 as the films are fed and indexed by the drive wheel assembly 108 into the film cutter assembly 126. The film guide may comprise any suitable apparatus such as that disclosed in U.S. Pat. No. 6,012,502 (incorporated herein by reference). As is explained in U.S. Pat. No. 6,012,502, the film cutter assembly 126 may be configured to enclose and guide the adhesive film 106 for cutting into predetermined, exact lengths.

The adhesive 116 (having had the coverlay film 112 removed) passes through the idler assembly 142 to the cutter assembly 126. The cutter assembly may comprise any suitable adhesive film cutting apparatus, such as the apparatus disclosed in U.S. Pat. No. 6,012,502. Referring to FIG. 3, the illustrated cutter assembly 126 includes a cutter block 154 mounted on a piston mechanism 164 for reciprocal movement in the y-axis direction. One or more film cutters 158 and one or more guide openings 160 are preferably included for aligning the adhesive 116 with the cutting blade 158 and the support element 42. The guide opening 160 is defined by the cutting blade 158 and opposing side rail 162.

The piston mechanism 164 preferably includes vacuum passages 168 in fluid communication with a vacuum conduit 170. The vacuum conduit 170 is in fluid communication with a vacuum source 176 and suitable control valves (not shown) for effecting cycling of the vacuum to the vacuum passages as required. The vacuum passages 168 apply a vacuum force to the adhesive 116, thereby securing the adhesive 116 to the cutter block 154 as the cutter block is moved slightly upward (in the Y-axis direction) to (first) press the adhesive 116 past the cutter blade 158. The cutter block 154 is then driven by the piston mechanism 164 further upward to press the cut adhesive strip 120 against the support element 42 (discussed further below). The piston mechanism 164 is operated by a device, such as a pneumatic air actuator or electric motor (not shown).

A peripheral outline of the cut adhesive strips 120 will match the peripheral outline of the guide opening 160. In the illustrative embodiment the adhesive strips 120 have a generally rectangular peripheral shape. However, other peripheral shapes, such as a square, are also possible. Depending upon the dimensions of the support element 42, the corresponding die site, and the width of bond wire slot 64 of the substrate 56 (FIGS. 2A–2E), the cutter blade 158 and guide opening 160 can be shaped and dimensioned as required.

The cutter blade 158 is preferably formed with a sharp, burr-free cutting edge for cutting the strips of adhesive. The cutter blade 158 preferably includes a finished surface (e.g., 8 micro inches). The side rail 162, defining the guide opening 160, is also preferably formed with a finished surface.

The support element 42 may be fed and indexed to the film cutter assembly 126 using a conventional support element handling apparatus (not shown), such as the handling apparatus manufactured by ESC Manufacturing Company of Warrington, Pa. (e.g., an ESC Apollo 9200 LOC die attach system). The support element 42 handling apparatus preferably includes guide members (not shown) for guiding the support element 42 and an indexer walk beam (not shown) for indexing the support element 42 to a location for applying the cut adhesive strips 120 to the reject die sites and/or the functional die sites. The support element handling apparatus preferably includes a heat block to provide heat if necessary to activate the adhesive strips 120.

OPERATION

Prior to the die attachment process (and the encapsulation process), defect substrates (and, thus, reject die sites) are detected and marked using conventional methods known to those persons skilled in the art. The cover member 48, such as an adhesive strip 120, may be attached to the reject die sites at a number of different stages during the semiconductor package manufacture process. The cover member 48, however, should be attached prior to the encapsulation process.

The adhesive dispensing apparatus 100 of the present invention applies the adhesive strip 120 to reject die sites (and functional die sites if so desired) of the support element 42. The applied adhesive strip 120 functions as the cover member 48 or may then have a cover member 48 attached thereto (if the adhesive was attached to a reject die site on the support element). Alternatively, the adhesive dispensing apparatus 100 of the present invention applies the adhesive strip 120 to the support element 42 to have a functional die attached thereto (if the adhesive strip were applied to a functional die site on the support element). The application of the adhesive strip 120 to the support element 42 is done synchronously with the removal of the coverlay film 112 from the adhesive film 106.

More specifically, the adhesive dispensing apparatus 100 of the present invention pulls the adhesive film 106 from the dispensing reel 104 and pushes the adhesive film in a downstream direction (i.e., toward the cutting apparatus) using friction forces provided by the drive wheel assembly 108. The stepper motor 122 drives the drive wheel assembly 108. The stepper motor 122 is pre-programmed to rotate a specific distance, which in turn pulls an exact amount of adhesive film 106 from the film reel 104 and pushes an exact amount of adhesive 116 into the cutting assembly 126.

The pinching or friction force (fpA) supplied by first spring 118 of the drive wheel assembly 108 holds the push wheels 110, 114 tightly against the adhesive film 106. The pinch wheel assembly 130 then removes the adhesive film's coverlay film 112. That is, as the drive wheel assembly 108 rotates, the coverlay film 112 is peeled away from the adhesive film 106 by a proportional exact amount as it is pulled from the film reel 104 and is pushed into the cutting assembly 126.

The idler assembly 142, by the urging force of the third spring 144, removes any slack in the adhesive film 106 that may have been caused by slippage between the driven push wheel 108 and the adhesive film 106. Likewise the idler assembly, by contraction of the third spring 144, ensures that the coverlay film 112 does not break or snap due to the pinch wheel assembly 130 moving the coverlay film more quickly than the drive wheel assembly 108 is moving the adhesive film 106. That is, the idler assembly acts as a push/pull system to take up or provide slack as necessary to prevent binding or breakage of the coverlay film 112.

The adhesive 116 that is moved into the cutter assembly 126 is then acted upon by a vacuum force that holds the adhesive 116 on the cutter block 154. The cutter block 154 is then moved in an upward (or y-axis) direction by the piston mechanism 164. As the cutter block 154, with the adhesive 116 held in position by vacuum forces, is moved through its upward stroke, the adhesive 116 contacts the cutting blade 158 which shears the adhesive into a specific size adhesive strips 120 or decals. The cutter block 154 continues to move in an upward direction until the adhesive strip 120 contacts the die site on the support element 42 (the support element die sites are positioned a specific distance above the adhesive dispensing apparatus 100).

The adhesive strip 120 is pressed against the support element die site with a predetermined specified force. When the support element 42 is contacted by the sized adhesive strip 120 mounted on the cutter block 154, the forces applied by the pneumatic actuator or electric motor force cause the adhesive strip 120 to stick to the die site. In addition, when contact is made the vacuum that held the adhesive strip 120 to the cutter block 154 is removed. The adhesive strip is specifically placed on the die site to cover from about 70% to about 100% of the wire bond slot 64.

The percentage of coverage of the wire bond slot 64 with the cover member 48 (e.g., adhesive strip 120) may vary depending upon the encapsulation material to be used and the width of the wire bond slot 64. Nonetheless, it has been discovered that for most conventional encapsulation materials and convention slot widths, the cover member 48 (e.g., the adhesive strip 120) should cover from about 70% to about 100% of the wire bond slot 64 opening. It has been discovered that when a cover member 48 (e.g., the adhesive strip 120) is attached to a reject die site 36 to completely cover (i.e., cover 100% of) wire bond slot 64 (as shown in FIG. 2D), a negative pressure on the first surface 44 of the substrate 56 may occur during the encapsulation process. A negative pressure may cause undesirable bending or bowing of the substrate 56 near or at the edges of the wire bond slot 64. It has also been discovered that 100% coverage of the wire bond slot 64 opening may work if the cover member (e.g., the adhesive strip 120) material and/or the adhesive (e.g., the adhesive strip 120) for attaching the cover member to the substrate 56 are sufficiently strong so as to withstand the encapsulation process pressures. It is possible, however, that with some substrate materials, the substrate 56 is deformed beyond acceptable limitations due to the pressures built up when the wire bond slot 64 is covered completely.

The optimum percentage of coverage of the wire bond slot 64 with the cover member 48 (e.g., the adhesive strip 120) will necessarily depend upon the encapsulation material to be used and the wire bond slot 64 width.

Nonetheless, it has also been discovered that when a cover member 48 (e.g., the adhesive strip 120) is attached to a reject die site 36 to cover just a major portion of the bonding slot 64 (i.e., from about 70% to about 98% or, more preferably from about 80% to about 95%, and most preferably about 90% coverage of the wire bond slot 64 opening) (see FIG. 2C) encapsulation material bleeding is virtually or completely eliminated. Furthermore, a negative pressure zone at the substrate 56 is not created during encapsulation.

It has also been discovered that when a cover member 48 (e.g., the adhesive strip 120) is attached to a reject die site 36 to cover a minor portion of the bonding slot 64 (i.e., less that about 65% of the wire bond slot 64 opening (see FIG. 2E) bleeding or flashing often occurs. On the other hand, 65% coverage is better than no coverage of the wire bond slot 64 opening. Further, bleeding is most frequently a problem when the encapsulation material enters the solder ball attachment pad area of the semiconductor package. Semiconductor packages having smaller pitches and less space between the solder ball attachment pads are more susceptible to contamination from encapsulation bleed than are semiconductor packages having wider pitches or greater spaces between the ball attachment pads.

The indexing, removal of coverlay film, cutting and application cycle is repeated for the next adhesive strip 120 application. More than a single adhesive dispensing apparatus 100 of the present invention may be operated in a side-by-side fashion to apply multiple cover members 48 to multiple reject die sites on a support element 42 or to apply multiple adhesive strips 120 to all die sites on a support element.

Whereas the invention has been described with reference to a number of embodiments of the apparatus and methods of the present invention, it will be understood that the invention is not limited to those embodiments. On the contrary, the invention is intended to encompass all modifications, alternatives, and equivalents as may be included within the spirit and scope of the invention as defined by the appended claims.

I claim:

1. An apparatus for synchronously removing a coverlay film from an adhesive film and attaching an adhesive strip cut from the adhesive film to a support element, comprising:

a reel of adhesive film;

a drive wheel assembly positioned downstream of the reel of adhesive film and configured to index the adhesive film;

a pinch wheel assembly positioned immediately above and adjacent to the drive wheel assembly, the pinch wheel assembly operable in conjunction with the drive wheel assembly to remove the coverlay film from the adhesive film;

a cutter assembly positioned downstream of the drive wheel assembly and the pinch wheel assembly, the cutter assembly comprising an opening having a peripheral outline defined by a cutting blade and a side rail, the opening configured to receive a leading terminal end of adhesive from the adhesive film and a portion of the adhesive following the leading terminal end, and a channel configured to guide the adhesive into the opening; and a cutting block configured to move through the opening to cut adhesive strips from the adhesive received within the opening and to apply the adhesive strip to the support element, the cutting block and the adhesive strip having the peripheral outline of the opening.

2. The apparatus of claim 1, further comprising an idler assembly positioned downstream of the drive wheel assembly and the pinch wheel assembly, the idler assembly configured to push or pull the adhesive film as needed to eliminate or add slack to the adhesive film before the coverlay film is removed therefrom.

3. The apparatus of claim 1, wherein the drive wheel assembly includes a driven push wheel and a lower push wheel that is positioned immediately below and adjacent to the driven push wheel.

4. The apparatus of claim 3, further comprising a first spring biasing the lower push wheel toward the driven push wheel and a second spring biasing the pinch wheel assembly toward the drive wheel assembly.

5. The apparatus of claim 1, further comprising a stepper motor coupled to the drive wheel assembly.

6. The apparatus of claim 2, wherein the idler assembly comprises an idler roller and a spring biasing the idler roller in a downstream direction.

7. The apparatus of claim 1, wherein the cutting blade is stationary.

8. The apparatus of claim 1, wherein the cutting blade is not disposed on a surface of the cutting block.

\* \* \* \* \*